(12) United States Patent
Wiklund

(10) Patent No.: US 7,595,693 B2
(45) Date of Patent: Sep. 29, 2009

(54) SYSTEM AND METHOD FOR PROVIDING A CONFIGURABLE INDUCTOR LESS MULTI-STAGE LOW-NOISE AMPLIFIER

(75) Inventor: Magnus O. Wiklund, San Jose, CA (US)

(73) Assignee: Fujitsu Limited, Kanagawa (JP)

( * ) Notice: Subject to any disclaimer, the term of this patent is extended or adjusted under 35 U.S.C. 154(b) by 0 days.

(21) Appl. No.: 11/961,455

(22) Filed: Dec. 20, 2007

(65) Prior Publication Data
US 2009/0160556 A1 Jun. 25, 2009

(51) Int. Cl.
*H03G 3/30* (2006.01)
(52) U.S. Cl. .................................. 330/282; 330/86
(58) Field of Classification Search ............ 330/282, 330/86, 98–100, 310
See application file for complete search history.

(56) References Cited
U.S. PATENT DOCUMENTS
6,754,478 B1 * 6/2004 Lee et al. ............. 455/232.1
7,292,097 B2 * 11/2007 Taylor .................. 330/98

* cited by examiner

*Primary Examiner*—Robert Pascal
*Assistant Examiner*—Hieu P Nguyen
(74) *Attorney, Agent, or Firm*—Baker Botts L.L.P.

(57) ABSTRACT

In accordance with a particular embodiment of the present invention, an apparatus is offered that includes a configurable feedback low noise amplifier (LNA) connected to a common source connected input transistor to realize a specific value of an input impedance, the input impedance being controlled by transconductance, the overall gain being defined by a global current feedback network. In more specific embodiments, the LNA is used to provide a wide frequency band and a defined input impedance. In other embodiments, the LNA achieves a low noise parameter and low output distortion. Also, the LNA can use a ladder network of grounded switches and floating resistors in order to avoid floating switches in a feedback path. The LNA can increase parametric yield. The LNA can be used to control noise, gain, distortion, and input impedance independently.

21 Claims, 4 Drawing Sheets

SYSTEM AND METHOD FOR PROVIDING A CONFIGURABLE INDUCTOR LESS MULTI-STAGE LOW-NOISE AMPLIFIER

TECHNICAL FIELD OF THE INVENTION

This invention relates generally to the field of processing and, more specifically, to a configurable inductor less multi-stage low-noise amplifier.

BACKGROUND OF THE INVENTION

Inductors are ubiquitous in today's processing world and may be especially prevalent in radio systems (e.g. in a given headset). A low noise amplifier (LNA) is typically used as the first stage at the antenna (sometimes there is a filter between the antenna and the LNA) and with a purpose to amplify the received weak RF signals from an antenna. For ideal reception, the LNA should be power matched to the source that is driving the input of the antenna. A good match usually means to provide 50 hm input impedance. In case there is a filter and a balun between the antenna and the LNA, the optimal input matching impedance may be different.

The LNA should also provide enough gain such that the amplified signal could be further processed with enough signal-to-noise ratio. The signal quality should be preserved and, hence, the generated distortion is of importance. Therefore, the ability to properly resolve these significant processing issues in the field of electronics creates an interesting challenge. As with all such processing operations, of critical importance are issues relating to speed, quality, minimal board space consumption, accuracy, and automation.

SUMMARY OF THE INVENTION

The present invention provides a method and a system for providing a configurable inductor less multi-stage low-noise amplifier that substantially eliminates or reduces at least some of the disadvantages and problems associated with previous methods and systems.

In accordance with a particular embodiment of the present invention, an apparatus is offered that includes a configurable feedback low noise amplifier (LNA) connected to a common source connected input transistor to realize a specific value of an input impedance, the input impedance being controlled by transconductance, the overall gain being defined by a global current feedback network, whereby the LNA does not include an inductor.

In more specific embodiments, the LNA is used to provide a wide frequency band and a defined input impedance. In other embodiments, the LNA achieves a low noise parameter and low output distortion. In addition, the LNA can use a ladder network of grounded switches and floating resistors in order to avoid floating switches in a feedback path. The LNA can increase parametric yield. The LNA can be used to control noise, gain, distortion, and input impedance independently. Moreover, the LNA can be used in software defined radio systems. Specifically, the LNA can be used in a system where noise, linearity, gain, or input matching is targeted.

Technical advantages of particular embodiments of the present invention include providing the ability to meet a design specification in terms of noise level, distortion level, signal gain, and input impedance matching. The present architecture offers enough degree of freedom such that each specification can be designed individually. The major challenge of designing the amplifier is moved toward the design of the internal amplifier: $H_i$.

Inherently, the proposed system offers an emphasis on configurability. In addition, it is possible to realize the LNA without use of inductors. Inductors usually occupy a large silicon area and are usually not well characterized. Thus, using inductors is costly both in terms of chip area and design time. Other advantages are detailed below with reference to corresponding FIGURES.

Other technical advantages will be readily apparent to one skilled in the art from the following figures, descriptions, and claims. Moreover, while specific advantages have been enumerated above, various embodiments may include all, some or none of the enumerated advantages.

BRIEF DESCRIPTION OF THE DRAWINGS

For a more complete understanding of particular embodiments of the invention and their advantages, reference is now made to the following descriptions, taken in conjunction with the accompanying drawings, in which.

DETAILED DESCRIPTION OF THE INVENTION

Figure 1:
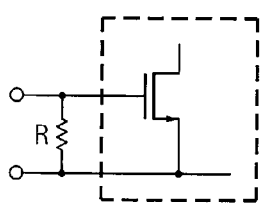
FIG. 1 is a simplified block diagram illustrating an example system that includes an input matching resistor.

FIG. 1 is a simplified block diagram illustrating an example system that includes an input matching resistor. Note that several techniques to achieve input matching are currently in existence. FIG. 1 depicts a simple input resistor that defines the input matching.

Figure 3:
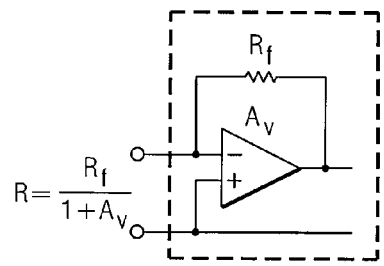
FIG. 3 is a simplified diagram illustrating a transimpedance amplifier.
Figure 2:
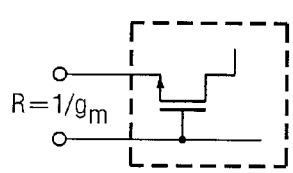
FIG. 2 is a simplified block diagram illustrating a common gate amplifier and other current feedback one-stage amplifiers.
Figure 2:
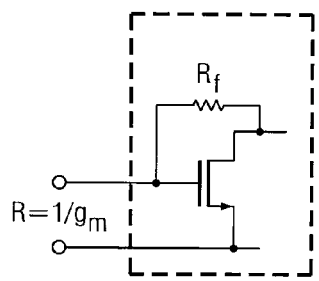
Figure 2:
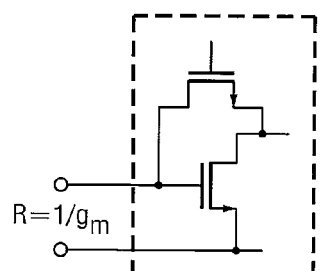

FIG. 2 is a simplified block diagram illustrating a common gate amplifier and other current feedback one-stage amplifiers. This depiction shows the common gate amplifier, where input impedance is determined by the inverse of the transconductance: $R_{in}=1/g_m$. FIG. 3 is a simplified diagram illustrating a transimpedance amplifier. The depicted transimpedance feedback amplifier offers an amplifier, two-stages, that has a voltage gain of $A_v$. With a shunt feedback resistor $R_f$, the input impedance is given by $R_{in}=R_f/(1+A_v)$.

Figure 4:
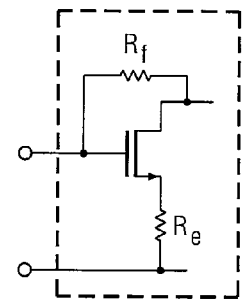
FIG. 4 is a simplified block diagram illustrating a series-shunt amplifier.
Figure 5:
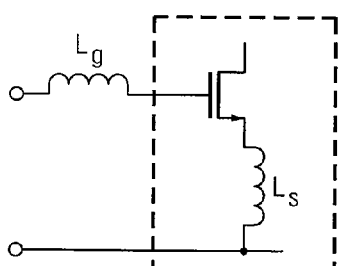
FIG. 5 is a simplified block diagram illustrating an inductive degenerated amplifier.

FIG. 4 is a simplified block diagram illustrating a series-shunt amplifier. This particular shunt-series amplifier includes two feedback loops: one shunt feedback resistor and one series feedback resistor. FIG. 5 is a simplified block diagram illustrating an inductive degenerated amplifier, which is the most popular. For the inductively degenerated amplifier, an inductor is used as the series feedback in order to create a real input impedance. However, an additional inductor [connected in series with the input] is typically needed in order to remove the imaginary part of the input impedance.

Figure 6:
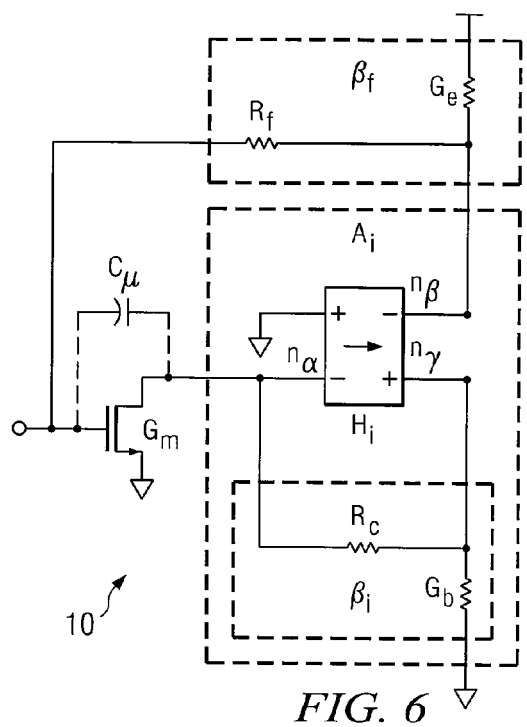
FIG. 6 is a simplified diagram illustrating a low-noise amplifier (LNA) principle and system, where the gain, noise, nonlinearity, input matching is controlled.

FIG. 6 is a simplified diagram illustrating a low-noise amplifier (LNA) principle and related system 10, where the gain, noise, nonlinearity, and input matching is controlled. The inductive degenerated amplifier has good performance, but the inductors are bulky and occupy considerable space: especially for integrated circuit design where inductors are costly. The inductively degenerated amplifier requires two inductors. The inductor in series with the input adds loss, which degrades the noise and gain properties. Nevertheless, the inductor version of the LNA is the most popular configuration when the lowest noise is needed.

The common-gate amplifier does not need inductors. The input matching is good, but the noise performance of a common gate configuration is not especially good. The signal-to-noise ratio is degraded at the output, compared to the signal-to-noise factor at the input source; the degradation is typically more than a factor two. The gain is also good with the common gate amplifier.

A solution with an input resistor solves the input matching problem, but the associated gain loss and deterioration of the signal-to-noise ratio usually makes this solution not feasible for a low noise amplifier. The series-shunt stage is a classical feedback structure, where two feedback loops are used to fix the input impedance. The noise properties deteriorate by the series resistor at the source. The gain is also limited because some of the gain is lost in the two feedback loops.

The transimpedance amplifier has recently become possible to integrate on CMOS technologies for RF circuits operating in the GHz range. Noise properties are good, however not as good as for the inductive degenerated amplifier. One problem is that the gain characteristics are affected by the same elements as the input matching characteristic. The loop-gain is also low, which means that the feedback will not improve the nonlinearity; the feedback is used to get the correct input impedance. In summary, the aforementioned LNA configurations all lack the possibility to determine the (1) gain; (2) input matching; (3) noise; and (4) linearity independently.

In contrast to these teachings, example embodiments of the present invention offer a viable solution that overcomes these problematic issues. In order to be able to tune the (1) gain, (2) input matching, (3) noise, and (4) linearity independently, a single stage amplifier is simply not sufficient. With a multi-stage amplifier, a significant degree of freedom can be introduced. In general, a multi-stage amplifier is associated with stability problems.

The proposed topology of FIG. 6 is constructed to control the loop dynamics without excessive interaction between the state variables in the circuit. FIG. 6 depicts the LNA principle where the gain, noise, nonlinearity, and input matching are controlled. $H_i$ is an amplifier.

In essence, the idea is as follows. The input stage can be a common source amplifier represented by its transconductance $G_m$. The noise performance of the LNA is [mainly] determined by the size and bias condition of this transistor. The input stage is followed by a current amplifier with a current gain of $A_i$. The current amplifier provides a low impedance loading of the input stage.

The loading input impedance of the current amplifier should be so small that the local (and unwanted) feedback of the input stage $G_m$, represented by $C_\mu$, is minimized. This configuration resembles that of a cascode, however, the present feedback circuit, $A_i$, can provide a lower input impedance since it is using a multistage amplifier $H_i$ (preferable a two-stage amplifier with well controlled dynamics). The linearity of the LNA is determined by the output stage of the $H_i$ amplifier and the loop gain within the $A_i$ amplifier.

There are two feedback networks. The global feedback network $\beta_f$ defines the overall current gain, whereas the feedback network $\beta_i$ in $A_i$ defines the internal current gain. The feedback networks are depicted as simple resistive feedback networks. Any type of feedback network that implements a current-to-current transfer can be used. Even active transistors can be used, for instance, a common gate amplifier could be used as a current feedback element. Transformers can also be used, but in this context it is assumed that the implementation of the feedback network occurs without any inductors.

Such architecture has numerous advantages, including the proposed topology being adequate to meet a design specification in terms of noise level, distortion level, signal gain, and input impedance matching. The present architecture offers enough degree of freedom such that each specification can be designed individually. The major challenge of designing the amplifier is moved toward the design of the internal amplifier $H_i$. Moreover, the present invention offers an architecture in which there is a wide band of frequencies [e.g., DC-upper frequency limit of a corresponding system] and well-defined input impedance.

Inherently, the proposed system offers an emphasis on configurability. In addition, it is possible to realize the LNA without inductors. Inductors usually occupy a large silicon area and are usually not well characterized. Thus, using inductors is costly both in terms of chip area and design time. Other advantages are detailed below.

With the component symbols used in FIG. 6, the feedback networks are characterized by:

$$\beta_f = \frac{G_f}{G_f + G_e} \qquad \text{(eq. 1-2)}$$

$$\beta_i = \frac{G_c}{G_c + G_b} \approx 1/A_i$$

where $G=1/R$ has been used in $G_f=1/R_f$ and $G_c=1/R_c$ to transform to the simplest representation.

Figure 7:
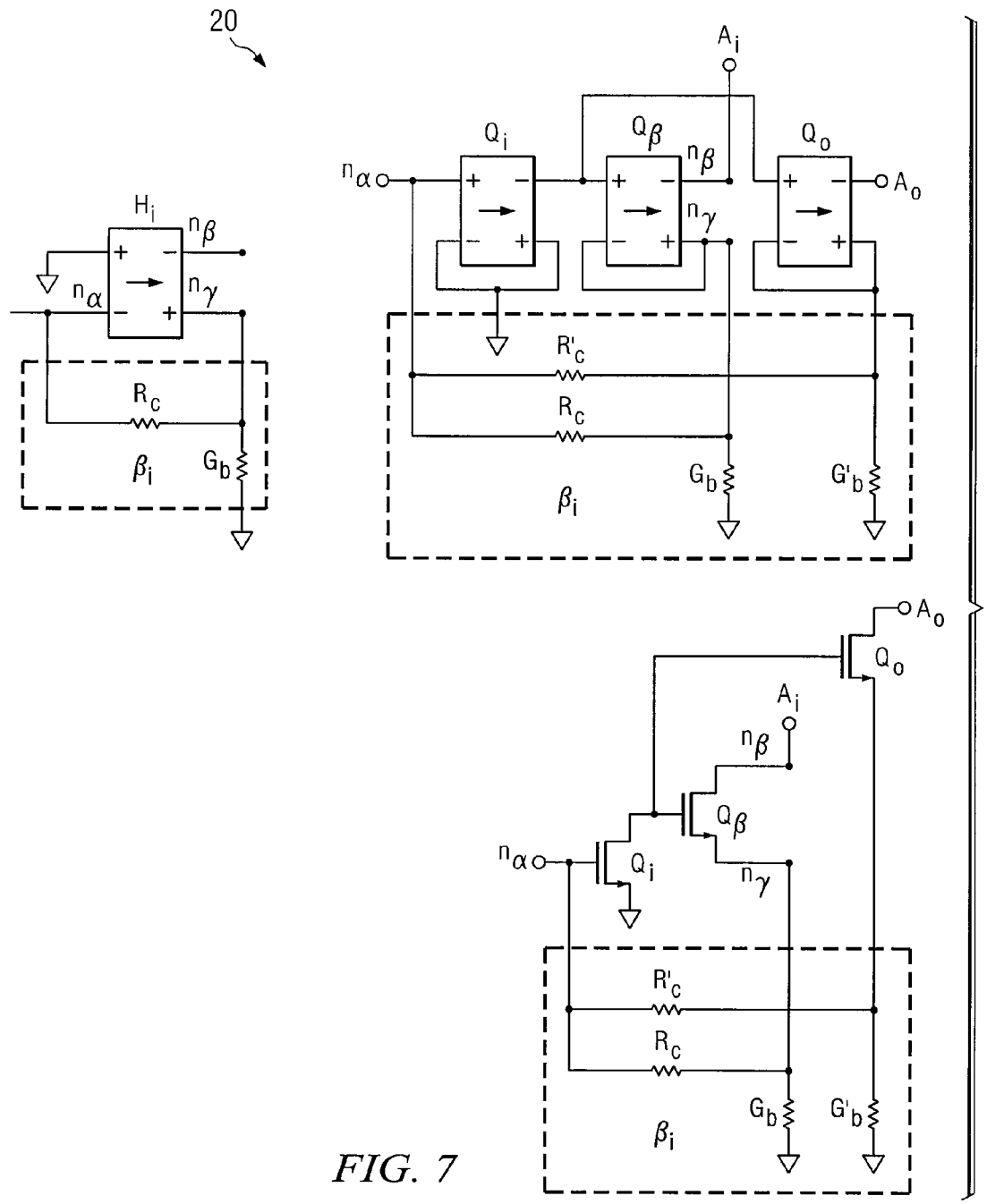
FIG. 7 is a simplified block diagram illustrating an implementation of the amplifier with a mirrored output current.
Figure 8:
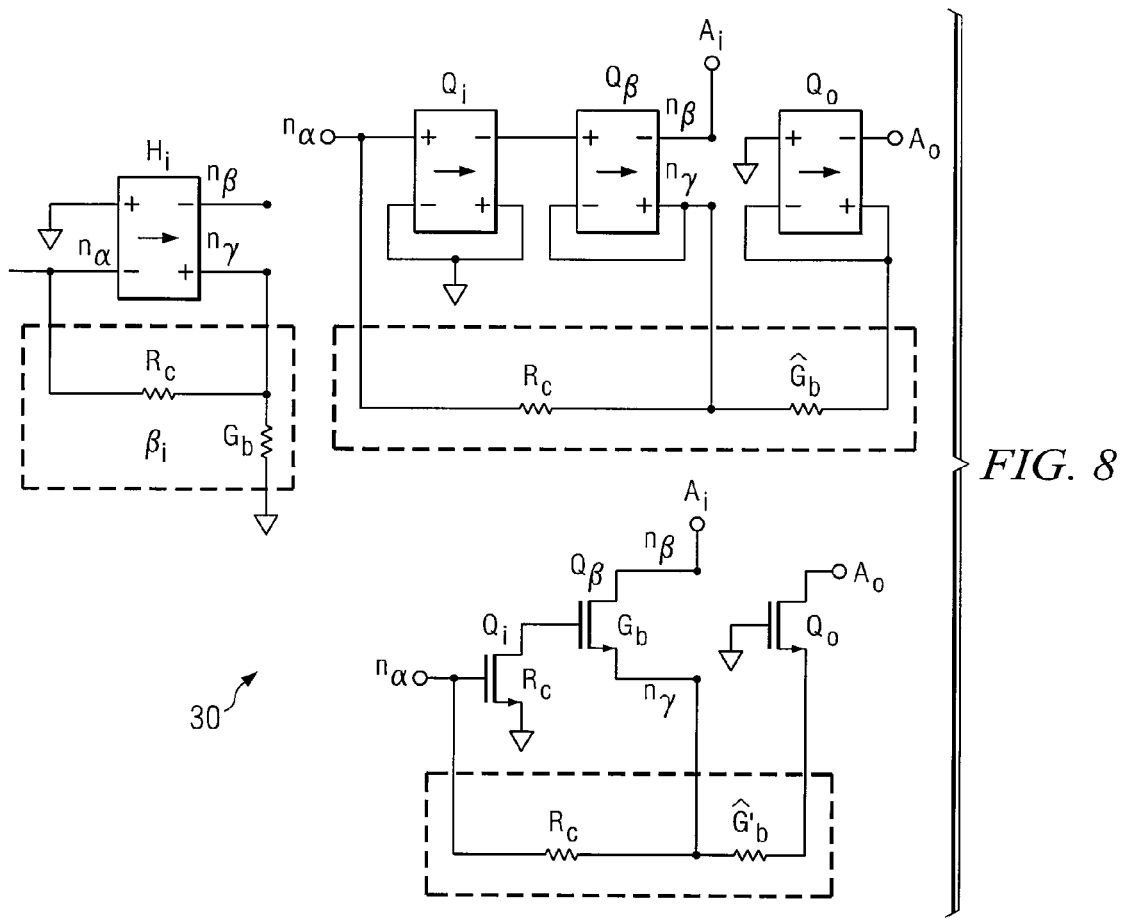
FIG. 8 is a simplified block diagram illustrating an implementation of the amplifier with a common gate output.

FIG. 7 is a simplified block diagram illustrating an implementation of the amplifier with a mirrored output current, whereby the whole system is denoted by an arrow 20. FIG. 8 is a simplified block diagram illustrating an implementation of the amplifier with a common gate output, whereby the whole system is denoted by an arrow 30.

The implementations of FIGS. 7 and 8 are of the current amplifier $A_i$, where FIG. 7 is depicting an implementation of the $H_i$ amplifier with a mirrored output current and FIG. 8 is depicting an implementation of the $H_i$ amplifier with a common gate output. Both of the implementations are based on a two-stage amplifier with current feedback. Depending on the loop gain needed, a more complex amplifier can be built where the single transistors are replaced by, for instance, cascodes or long-tail pairs (common technique) in order to improve the loop gain. The feedback network $\beta_i$ and the internal amplifier $H_i$ are connected in parallel. Since the input current to the current amplifier is split into the two paths, the current gain in Eq. 2 should be modified. However, if $\tilde{R}_c$ is removed and $\tilde{G}_b = G_b + G_c$ then Eq. 2 still holds.

The design problem is translated into the task of designing a well-controlled current amplifier with two current outputs, one for the overall feedback network and another for the output current. The above design procedure is summarized as follows:

1. Design the input stage $G_m$, for noise performance.
2. Design the global feedback network for overall gain.
3. Design the feedback of the internal current amplifier $A_i$ for input matching.
4. Design the internal amplifier $H_i$ to meet the harmonic distortion specification.

[Suffice to say, the design procedure does not guarantee an optimum design for all possible specifications.]

In terms of input matching, based on two-port theory, the input impedance is conveniently determined by the ABCD parameters and the load at the output of the two-port according to:

$$Z_{in} = \frac{A + BG_L}{C + DG_L} \quad \text{(eq. 3)}$$

This equation is somewhat general. In this case, of interest is controlling the input impedance when the two ports are connected to a current amplifier. In order to simplify the analysis, and to identify the load $G_L$, the LNA block diagram in FIG. 6 is modified.

Figure 9:
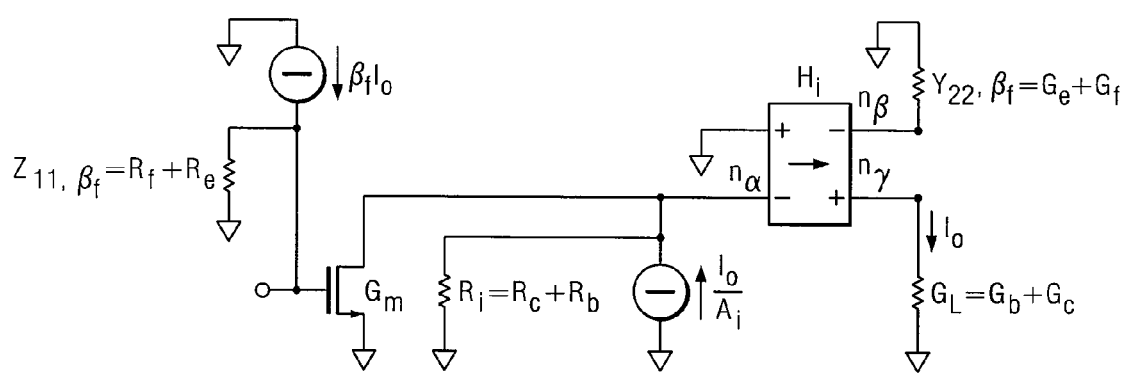
FIG. 9 is a simplified block diagram where the feedback network is identified as the load.

FIG. 9 is a simplified block diagram where the feedback network is identified as the load. In FIG. 9, the feedback networks, for $\beta_f$ and $A_i$ has been replaced by approximate networks, where the loading effects are detailed as well as the feedback transmission. The forward transmission in the feedback networks has been left out in order to simplify the block diagram. FIG. 9 is depicting an LNA block diagram, where the feedback network of $A_i$ is identified as the load $G_L$.

Assume the current amplifier $A_i$ is characterized as $D_{A_i}$. Further assume the amplifier is a perfect current amplifier, where all other transmission parameters $A_{A_i}$, $B_{A_i}$, and $C_{A_i}$ are zero. The input transistor is represented by a full set of transmission parameters $A_{G_m}$, $B_{G_m}$, $C_{G_m}$, and $D_{G_m}$. In that case, the ABCD parameters for the complete system are:

$$\begin{bmatrix} A_{G_m} & B_{G_m} \\ C_{G_m} & D_{G_m} \end{bmatrix} \cdot \begin{bmatrix} 0 & 0 \\ 0 & D_{A_i} \end{bmatrix} = \begin{bmatrix} 0 & B_{G_m} D_{A_i} \\ 0 & D_{G_m} D_{A_i} \end{bmatrix} \quad \text{(eq. 4)}$$

As a result, the input impedance is given by:

$$Z_{in} = \frac{B_{G_m}}{D_{G_m}} \quad \text{(eq. 5)}$$

This impedance is not well controlled. The trick is to design an amplifier with a controlled C and to apply global feedback that adjusts D. The global feedback is represented by $D_\beta$. A block diagram of the proposed LNA is given in FIG. 6.

The ABCD parameters for this system are:

$$\begin{bmatrix} 0 & B_{G_m} D_{A_i} \\ 0 & D_{G_m} D_{A_i} + D_{\beta_f} \end{bmatrix} \quad \text{(eq. 6)}$$

Hence, the input impedance is controlled to be:

$$Z_{in} = \frac{B_{G_m}}{D_{G_m} + \frac{D_{\beta_f}}{D_{A_i}}} = \frac{1/g_m}{\frac{1}{h_{21}} + A_i \beta_f} \rightarrow \frac{1}{g_m A_i \beta_f} \quad \text{(eq. 7)}$$

where the approximation holds as long as there is enough loop gain $h_{21} A_i \beta_f \gg 1$. The overall gain is controlled by $\beta_f$ (passive or active current feedback), whereas the linearity is controlled by the linearity of $A_i$ (internal feedback) and the noise properties are controlled by the biasing of the input transistor $G_m$ (replica biasing).

In terms of noise performance, the noise properties are determined by the combined design of the internal current amplifier $H_i$, the input transistor $G_m$, and the global feedback circuit $\beta_f$. The noise degradation due to, for instance, feedback resistors can be made negligible. A feedback resistor $R_f \gg R_s$ that generates less current noise than the source resistance will only slightly degrade the total noise of the system. The same argument holds if an active element is part of the feedback network: provided the equivalent input current noise is less than what is generated by the source impedance (i.e., a low noise system).

An optimal noise design would minimize the noise figure.

$$F = F_{min} + \frac{[(G_s - G_{opt})^2 + (B_s - B_{opt})^2] R_v}{G_s} \quad \text{(eq. 8)}$$

As an example, the noise parameters from a given device (Enz 2006) are used:

$$R_v = 1.25 \frac{\gamma_{nD}}{G_m} \quad \text{(eq. 9-12)}$$

$$G_{opt} \cong 0.5 \omega C_{GS}$$

$$B_{opt} \cong -0.8 \omega C_{GS}$$

$$F_{min} \cong 1 + \frac{\omega}{\omega_T}$$

These noise parameters include the effect of induced gate noise, drain noise, and substrate resistance noise.

Assume an LNA design, where only the real part is optimum, $G_s = G_{opt}$, and there is no inductor at the input to noise tune for $B_{opt}$ (that is $B_s = 0$), then it follows when inserting the noise parameters in Eq. 9-Eq. 12 into the noise factor formula (given by Eq. 8) that the noise factor deviates from the optimum value according by:

$$F - F_{min} = \frac{B_{opt}^2 R_v}{G_s} \cong \frac{0.8}{0.5} \gamma_{nD} \frac{\omega}{\omega_T} \quad \text{(eq. 13)}$$

Assuming the thermal noise excess factor $\gamma_{nD}$ is less than unity and $\omega_T > 8\omega$, then $F - F_{min} < 0.2$. The increase in the noise figure is less than 0.7 dB, that is, the minimum noise figure increases from 0.5 dB to 1.2 dB. An optimum noise figure of 2 dB is degraded by only 0.5 dB. The noise factor for the LNA that does not have any complex noise matching circuit is:

$$F \cong 1 + 2.6\gamma_{nD}\frac{\omega}{\omega_T} \quad \text{(eq. 14)}$$

The consequence of this relation is interesting. As technology matures, the noise figure can be improved drastically. The loss in optimum noise figure is compensated by the fact that there is no input loss associated with an input inductor. In addition, the input inductor resonates with the input gate and, hence, tends to increase the harmonic distortion generated by the input transistor.

In regards to distortion considerations, distortion considerations are due to low noise considerations. The overall design of an amplifier is simplified if the input transistor is the limiting factor for the noise properties and the output stage determines the distortion. Of special consideration is the generation of third order harmonics. The intercept point when the harmonics is equal to the fundamental signal is denoted IP. The input level for the intercept point is called the Input Intercept Point (IIP). For the LNA the following is an expression for the third order input intercept point:

$$\frac{1}{IIP3} \cong \frac{1}{IIP3_{Gm}} + \frac{G_{G_m}}{IIP3_{A_i}} \quad \text{(eq. 15)}$$

Provided that there is enough gain $G_{G_m}$ in the input stage, it is the $IIP3_{A_i}$ that dominates the total IIP3. The actual gain definition has not been defined here. In the present case, the LNA is working in current mode, the output quantity is a current, and the global feedback quantity is also a current. The input quantity from the source is power and, hence, the input quantity to the input stage $G_m$ can be viewed as a voltage that controls the output current of the input transistor. The output transistor in FIG. 8 ($Q_o$) is in a well-designed LNA responsible for the majority of the generated distortion. The actual distortion that reaches the output is controlled by local and global feedback: mainly by the feedback that determines $A_i$ since the global loop gain is assumed to be kept low.

The harmonic distortion in the output signal is reduced by the actual feedback, or return difference ($F_o = 1 - \beta_o Q_o$) at the output transistor. The output feedback network, here denoted as $\beta_o$, is part of the feedback network that defines the current gain $A_i$. In order to reduce the distortion, the return difference should be changed. It may be sufficient to modify the feedback network $\hat{\beta}_o$ under the constraint that $A_i$ is not changed.

Another measure is to change bias current of the output transistor or to modify the topology of the current amplifier. Adding yet another transistor stage in front of the output transistor improves the loop gain but makes stability issues more crucial. In order not to violate the behavior of the overall system, it is important that $A_i$ is well behaved and should not risk stability. The design task of $A_i$ is crucial, the required improvement in the return difference is useful as a measure how difficult it will be to improve the linearity. In order to improve the linearity to a specified $I\hat{I}P3_{A_i}$, then the return difference needs to be improved by the following factor:

$$\frac{\hat{F}_o}{F_o} = \frac{I\hat{I}P3_{A_i}}{IIP3_{A_i}} \quad \text{(eq. 16)}$$

The actual implementation of the current amplifier does not change the principle of the inductor-less LNA topology, as detailed in FIG. 6. Other circuit implementations detailed in this text are possible as long as the basic properties of $A_i$ are not changed. The input impedance should be low and the current gain should be well defined.

In terms of the overall gain, the overall current gain is given by:

$$\approx \frac{1}{\beta_f}\frac{M_o}{M_\beta} \quad \text{(eq. 17)}$$

where $M_o/M_\beta$ represents the scaling of current between the output transistor and the transistor that provides the current to the global feedback network $\beta_f$. This extra design of freedom can be used to relax the global loop gain requirement from the overall current gain requirement.

In regards to robustness, the original idea of the LNA was that a good current amplifier succeeding the input transistor would simplify the design considerably. The loop dynamics are also simplified, as long as each block in the loop can be realized with little interactions of the dynamics between the blocks. The unwanted behavior is denoted by a $\Delta$, followed by the transmission parameter in the ABCD matrices for the complete system:

$$\begin{bmatrix} A_{G_m} & B_{G_m} \\ C_{G_m} & D_{G_m} \end{bmatrix} \cdot \begin{bmatrix} \Delta A_{A_i} & \Delta B_{A_i} \\ \Delta C_{A_i} & \Delta D_{A_i} \end{bmatrix} + \begin{bmatrix} \Delta A_{\beta_f} & \Delta B_{\beta_f} \\ \Delta C_{\beta_f} & \Delta D_{\beta_f} \end{bmatrix} = \quad \text{(eq. 18)}$$

$$\begin{bmatrix} 0 & B_{G_m}D_{A_i} \\ 0 & D_{G_m}D_{A_i} + D_{\beta_f} \end{bmatrix} + \begin{bmatrix} (A_{G_m}\Delta A_{A_i} + B_{G_m}\Delta C_{A_i} + \Delta A_{\beta_f}) & (A_{G_m}\Delta B_{A_i} + \Delta B_{\beta_f}) \\ (C_{G_m}\Delta A_{A_i} + D_{G_m}\Delta C_{A_i} + \Delta C_{\beta_f}) & (C_{G_m}\Delta B_{A_i}) \end{bmatrix}$$

It is clear that many unwanted interactions are possible if the blocks are not well designed. The input impedance may now have the following expression:

$$Z_{in} = \frac{(B_{G_m}D_{A_i} + A_{G_m}\Delta B_{A_i} + \Delta B_{\beta_f})G_L + A_{G_m}\Delta A_{A_i} + B_{G_m}\Delta C_{A_i} + \Delta A_{\beta_f}}{(D_{G_m}D_{A_i} + D_{\beta_f} + C_{G_m}\Delta B_{A_i})G_L + C_{G_m}\Delta A_{A_i} + D_{G_m}\Delta C_{A_i} + \Delta C_{\beta_f}} = \quad \text{(eq. 19)}$$

$$\hat{Z}_{in} \times \frac{\left(\frac{1 + A_{G_m}\Delta B_{A_i} + \Delta B_{\beta_f}}{B_{G_m}D_{A_i}}\right)G_L + \frac{A_{G_m}\Delta A_{A_i} + B_{G_m}\Delta C_{A_i} + \Delta A_{\beta_f}}{B_{G_m}D_{A_i}}}{(1 + 1/T + 1/T_\Delta)G_L + \frac{C_{G_m}\Delta A_{A_i} + D_{G_m}\Delta C_{A_i} + \Delta C_{\beta_f}}{D_{\beta_f}}}$$

The expression has been rearranged in order to make further simplifications possible based on the desired loop gain:

$$T = D_{\beta_f}/(D_{G_m}D_{A_i})$$

and the desired input impedance:

$$\hat{Z}_{in} = (B_{G_m}D_{A_i})/D_{\beta_f}$$

Due to imperfections of the current amplifier $\Delta B_{A_i}$ there is yet another path:

$$1/T_\Delta = C_{G_m} \Delta B_{A_i}/D_{\beta_f}$$

This builds up the current loop-gain. The effective loop gain associated with the current gain is added in parallel:

$$1/T_D = 1/T + 1/T_\Delta$$

The design criteria is based on the premise that $G_L$ should be a dominate admittance. The following conditions should make the design task straightforward:

$$G_L \gg Y_{22,G_m}$$

$$G_L \gg Y_{22,A_i}$$

$$G_L \gg Y_{22,\beta_f}$$

$$G_{11,A_i} \gg G_{22,G_m} \quad \text{(eq. 20-23)}$$

In regards to making the LNA configurable, the presented topology is specifically designed to enable control of the input matching, noise, distortion, and gain. During the design phase, the degree of freedom can be used to meet a given specification. If each degree of freedom can be controlled by making components tunable, then it is possible to tune the design after the chip has been designed.

The tuning process may be activated before a product is being shipped or the LNA may be tuned during operation in order to account for changed operating conditions such as temperature variations or aging. If the LNA can be changed during operation, the parametric yield can be increased. The tuning capability may also be used if some properties are changed during operation. The extreme case would be if the configurable LNA were used in a software-defined radio. The specifications may then vary between different radio standards and the LNA should be able to be adjusted accordingly.

Figure 10:
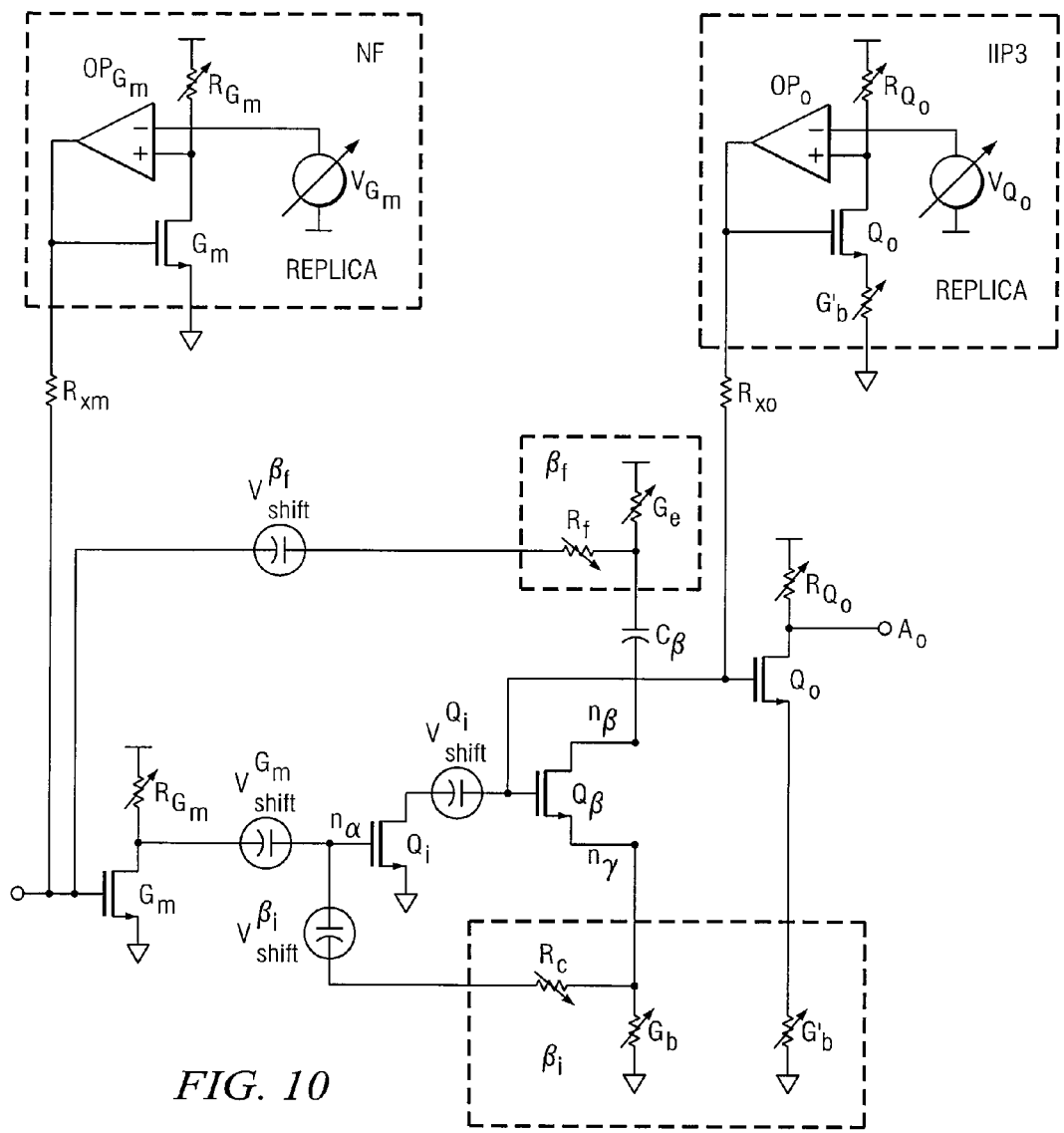
FIG. 10 is a simplified block diagram illustrating a configurable LNA utilizing replica circuits for bias control.

FIG. 10 is a simplified block diagram illustrating a configurable LNA utilizing replica circuits for bias control. FIG. 10 details all the components that could be needed for a fully configurable LNA [based on the flexible LNA topology as described in FIG. 6]. A general notion is used to denote variable elements such as a controllable resistor and a controllable voltage source. For compatibility with digital signal processing, assume that the variable elements are digitally controlled.

The low noise input stage (represented by $G_m$) is biased for desired noise properties using a controlled voltage source $V_{G_m}$ and a controlled drain resistor $R_{G_m}$. The drain bias current is determined by $V_{G_m}/R_{G_m}$ and the drain voltage is determined by $V_{G_m}$. The operational amplifier ($OP_{G_m}$) controls the gate voltage to satisfy both the specified drain current and the specified drain voltage. The gate voltage is copied to the circuit with a bias resistor $R_{xm}$.

The output stage, represented by $Q_o$, can also adjust the bias current and the drain voltage for a desired bias point with respect to distortion products. The output stage is controlled by a replica and an operational amplifier $OP_o$; the same principle as for the input stage. The gate voltage of the replica is copied to the circuit with a bias resistor $R_{xo}$. The local feedback is adjusted by $\tilde{G}_b$, which for simplicity can be tracked with $G_b$.

The internal current amplifier $A_i$ is controlling the gain with controllable resistors $G_b$ and $R_c$. The overall gain, determined by $\beta_f$ is controlled by the controllable resistors $G_e$ and $R_f$. The extra degree of freedom to scale the output stage $Q_o$ with respect to the stage $Q_\beta$ that provides the feedback current has not been utilized in FIG. 10. Such an arrangement would need to scale the output transistor $Q_o$ and $\tilde{G}_b$ according to Eq. 17, that is the width of $Q_o$ should be scaled by $M_o/M_\beta$ and the conductance of the local feedback resistor $\tilde{G}_b$ should also be scaled by $M_o/M_\beta$.

The voltage shift between the stages has been denoted by $V_{shift}^{G_m}$, $V_{shift}^{\beta_f}$, $V_{shift}^{\beta_i}$, and $V_{shift}^{Q_i}$. For simplicity, a capacitor is used as a voltage shift. A capacitor $C_\beta$ is also used to isolate the feedback network from the drain node of the feedback transistor $Q_\beta$. The voltage shift could be implemented with active elements and could also be controllable.

The implementation of a digitally controlled passive feedback network can be non-trivial due to the additional parasitics that are associated with the switches and the selectable resistors. Since the switched resistances have a low impedance, typically in the order of 10'ths of ohms up to a few hundred ohms, the MOS switches should be sufficiently large in order to be considered as a good switch. The floating switches are not desirable since there are two nodes for each switch that gets loaded with parasitic capacitances. The grounded switch is better since only the drain of the switch contributes with a parasitic capacitor.

Figure 11:
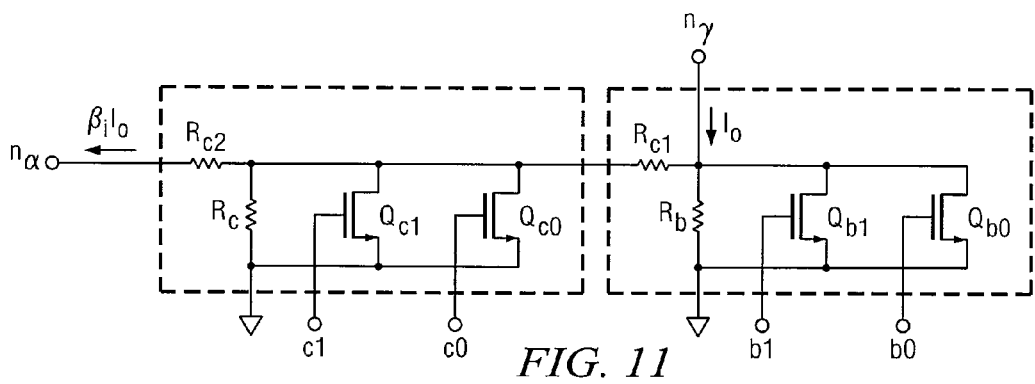
FIG. 11 is a simplified block diagram illustrating a variable feedback network where the feedback factor is determined by digitally controlled switches.

The feedback networks can be implemented as in FIG. 11. FIG. 11 is a simplified block diagram illustrating a variable feedback network where the feedback factor is determined by digitally controlled switches c1, c0, b1, and b0. The implementation avoids floating switches by extending the feedback network as a ladder network, where the effective feedback factor is controlled by two feedback networks connected in cascade.

The feedback architecture is also selected such as the highest linearity is given when the switches are off. In the off state the local feedback, determined by $R_b$ and $Q_o$, is maximum and, hence, the distortion is minimized. In the off state, the feedback loop through $\beta_i$ is also maximized, which further reduces the distortion in the output stage. Resistors are more linear than a transistor used as a resistor. For high linearity applications, this fact should be considered.

The digitally controlled gain, as implemented in FIG. 11, can be controlled according to:

$$A_i \approx \left(1 + \frac{G_b(b_1, b_0)}{G_{c1}}\right)\left(1 + \frac{G_c(c_1, c_0)}{G_{c2}}\right) + \frac{G_b(b_1, b_0)}{G_{c2}} \quad \text{(eq. 24)}$$

In this example case, the variable resistor is controlled by 2 bits. More bits can be added if needed. A typical n-bit implementation of each programable resistor is:

$$G(g_1, g_0) = \sum_{i=0}^{n-1} 2^i \Delta G b_i + G_{min} \quad \text{(eq. 25)}$$

where $$\Delta G = \frac{G_{max} - G_{min}}{2^n - 1} \quad \text{(eq. 26)}$$

This makes the conductance be variable between $G_{min}$ and $G_{max}$ in increments of $\Delta G$. Thus, FIG. 11 is depicting a variable feedback network, where the feedback factor $\beta_i$ is determined by digitally controlled switches c1, c0, b1, and b0.

It is critical to note that the components illustrated in FIGS. 6-11 may be implemented as digital circuits, hardware, analog circuits, software, or any suitable combination of these elements. In addition, any of these illustrated components may include software and/or an algorithm to effectuate their features and/or applications as described herein. The software can execute code such that the functions outlined herein can be performed.

Alternatively, such operations and techniques may be achieved by any suitable hardware, component, device, application specific integrated circuit (ASIC), additional software, field programmable gate array (FPGA), processor, erasable programmable ROM (EPROM), electrically erasable programmable ROM (EEPROM), or any other suitable object that is operable to facilitate such operations. Considerable flexibility is provided by the structure of these architectures in the context of this arrangement. Thus, it can be easily appreciated that such functions could be provided external to the outlined environment. In such cases, such functionality could be readily embodied in a separate component, device, or module.

While the present invention has been described in detail with specific components being identified, various changes and modifications may be suggested to one skilled in the art and, further, it is intended that the present invention encompass any such changes and modifications as clearly falling within the scope of the appended claims.

Note also that, with respect to specific process flows disclosed, any steps discussed within the flows may be modified, augmented, or omitted without departing from the scope of the invention. Additionally, steps may be performed in any suitable order, or concurrently, without departing from the scope of the invention.

Numerous other changes, substitutions, variations, alterations, and modifications may be ascertained to one skilled in the art and it is intended that the present invention encompass all such changes, substitutions, variations, alterations, and modifications as falling within the scope of the appended claims.

What is claimed is:

1. A method, comprising:
   implementing a configurable feedback low noise amplifier (LNA) connected to a common source connected input transistor to realize a specific value of an input impedance, the input impedance being controlled by transconductance, the overall gain being defined by a global current feedback network, whereby the LNA does not include an inductor;
   wherein the LNA uses a ladder network of grounded switches and floating resistors in order to avoid floating switches in a feedback path.

2. The method of claim 1, wherein the LNA is used to provide a designated frequency band and a defined input impedance.

3. The method of claim 1, wherein the LNA achieves a low noise parameter and low output distortion.

4. The method of claim 1, wherein the LNA increases parametric yield.

5. The method of claim 1, wherein the LNA is used to control noise, gain, distortion, or input impedance independently.

6. The method of claim 1, wherein the LNA is used in software-defined radio systems.

7. The method of claim 1, wherein the LNA is used in a system where noise, linearity, gain, or input matching is targeted.

8. An apparatus, comprising:
   a configurable feedback low noise amplifier (LNA) connected to a common source connected input transistor to realize a specific value of an input impedance, the input impedance being controlled by transconductance, the overall gain being defined by a global current feedback network, whereby the LNA does not include an inductor;
   wherein the LNA uses a ladder network of grounded switches and floating resistors in order to avoid floating switches in a feedback path.

9. The apparatus of claim 8, wherein the LNA is used to provide a designated frequency band and a defined input impedance.

10. The apparatus of claim 8, wherein the LNA achieves a low noise parameter and low output distortion.

11. The apparatus of claim 8, wherein the LNA increases parametric yield.

12. The apparatus of claim 8, wherein the LNA is used to control noise, gain, distortion, or input impedance independently.

13. The apparatus of claim 8, wherein the LNA is used in software-defined radio systems.

14. The apparatus of claim 8, wherein the LNA is used in a system where noise, linearity, gain, or input matching is targeted.

15. Logic embedded in a computer medium and operable to:
   implement a configurable feedback low noise amplifier (LNA) connected to a common source connected input transistor to realize a specific value of an input impedance, the input impedance being controlled by transconductance, the overall gain being defined by a global current feedback network, wherein the LNA uses a ladder network of grounded switches and floating resistors in order to avoid floating switches in a feedback path.

16. The logic of claim 15, wherein the LNA is used to provide a wide frequency band and a defined input impedance.

17. The logic of claim 15, wherein the LNA achieves a low noise parameter and low output distortion.

18. The logic of claim 15, wherein the LNA increases parametric yield.

19. The logic of claim 15, wherein the LNA is used to control noise, gain, distortion, or input impedance independently.

20. The logic of claim 15, wherein the LNA is used in software-defined radio systems.

21. The logic of claim 15, wherein the LNA is used in a system where noise, linearity, gain, or input matching is targeted.

* * * * *

UNITED STATES PATENT AND TRADEMARK OFFICE
CERTIFICATE OF CORRECTION

| | | |
|---|---|---|
| PATENT NO. | : 7,595,693 B2 | Page 1 of 1 |
| APPLICATION NO. | : 11/961455 | |
| DATED | : September 29, 2009 | |
| INVENTOR(S) | : Magnus O. Wiklund | |

It is certified that error appears in the above-identified patent and that said Letters Patent is hereby corrected as shown below:

Column 5, Line 7, after "2. Design the global feedback network" insert -- $\beta_f$ --.

Signed and Sealed this
Ninth Day of August, 2011

David J. Kappos
*Director of the United States Patent and Trademark Office*